(12) United States Patent
Fan et al.

(10) Patent No.: US 6,512,696 B1
(45) Date of Patent: Jan. 28, 2003

(54) METHOD OF PROGRAMMING AND ERASING A SNNNS TYPE NON-VOLATILE MEMORY CELL

(75) Inventors: Tso-Hung Fan, Taipei (TW); Tao-Cheng Lu, Kaohsiung (TW); Samuel Pan, Hsin-Chu (TW); Ta-Hui Wang, Hsin-Chu (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 09/986,932

(22) Filed: Nov. 13, 2001

(51) Int. Cl.⁷ ................................................ G11C 16/04
(52) U.S. Cl. ........................ 365/185.18; 365/185.27; 365/185.28
(58) Field of Search ........................ 365/185.18, 185.26, 365/185.27, 185.28, 185.29, 185.14; 257/324, 325

(56) References Cited

U.S. PATENT DOCUMENTS

| | | | | |
|---|---|---|---|---|
| 5,535,158 A | * | 7/1996 | Yamagata | 365/185.28 |
| 6,285,596 B1 | * | 9/2001 | Miura et al. | 365/185.03 |
| 6,363,012 B1 | * | 3/2002 | Lin et al. | 365/185.18 |

* cited by examiner

*Primary Examiner*—David Lam

(57) ABSTRACT

A method of programming and erasing a SNNNS type non-volatile memory cell is provided. The programming operation is performed by channel hot electron injection from a drain side to an intermediate silicon nitride layer. The erasing operation is performed by channel hot hole injection from a drain side to an intermediate silicon nitride layer. The SNNNS type non-volatile memory cell provides highly efficient hot carrier injection under low applied voltages, both for programming and erasing operations. Thus, the present method provides improved performance characteristics such as shorter programming/erasing times and lower applied voltages.

18 Claims, 2 Drawing Sheets

METHOD OF PROGRAMMING AND ERASING A SNNNS TYPE NON-VOLATILE MEMORY CELL

BACKGROUND OF THE INVENTION

1. Field of the Invention

The present invention relates to a method for programming and erasing a memory device, and more particularly to a method for programming and erasing a non-volatile memory device with a multi-layer gate insulating structure.

2. Description of the Prior Art

Memory devices for non-volatile storage of information are currently in widespread use today, being used in a myriad of applications: A few examples of non-volatile semiconductor memory include read only memory (ROM), programmable read only memory (PROM), erasable programmable read only memory (EPROM), electrically erasable programmable read only memory (EEPROM) and flash EEPROM.

Semiconductor ROM devices, however, suffer from the disadvantage of not being electrically programmable memory devices. The programming of a ROM occurs during one of many steps in manufacturing, using special masks containing the data to be stored. Thus, the entire contents of a ROM must be determined before manufacturing. In addition, because ROM devices are programmed during manufacturing, the time delay before the finished product is available could be six weeks or more. The advantage, however, of using ROM for data storage is the low cost per device. However, the penalty is the inability to change the data once the masks are committed. If mistakes in the data programming are found they are typically very costly to correct. Any inventory that exists having incorrect data programming is instantly obsolete and probably cannot be used. In addition, extensive time delays are incurred because new masks must first be generated from scratch and the entire manufacturing process repeated. Also, the cost in savings with the use of ROM memories only exist if large quantities of ROM are produced.

Moving to EPROM semiconductor devices eliminates the necessity of mask programming the data but the complexity of the process increases drastically. In addition, the die size is larger due to the addition of programming circuitry and there are more processing and testing steps involved in the manufacturing of these types of memory devices. An advantage of EPROM's is that they are electrically programmed, but for erasing, EPROM's require exposure to ultraviolet (UV) light. These devices are constructed with windows transparent to UV light to allow the die to be exposed for erasing; this must be performed before the device can be programmed. A major drawback to these devices is that they lack the ability to be electrically erased. In many circuit designs it is desirable to have a non-volatile memory device that can be erased and reprogrammed in-circuit, without the need to remove the device for erasing and reprogramming.

Semiconductor EEPROM devices also involve more complex processing and testing procedures than ROM, but have the advantage of electrical programming and erasing. Using EEPROM devices in circuitry permits in-circuit erasing and reprogramming of the devices. The widespread use of EEPROM semiconductor memory has prompted much research focusing on constructing better memory cells. Active areas of research have focused on developing a memory cell that has improved performance characteristics such as shorter programming times, utilizing lower voltages for programming and reading, longer data retention times, shorter erasing times and smaller physical dimensions. One such area of research involves a memory cell that has an insulated gate.

Accordingly, it is the intention to develop a method of programming and erasing an EEPROM memory device, which can show the above improved performance characteristics, by utilizing superior properties of the memory cells.

SUMMARY OF THE INVENTION

It is an objective of the present invention to provide a method of programming a SNNNS type non-volatile memory device by using a channel hot electron injection to trap negative charges in an intermediate trapping layer under low applied voltages.

It is anther objective of the present invention to provide a method of erasing a SNNNS type non-volatile memory device by using channel hot hole injection to trap positive charges in an intermediate trapping layer under low applied voltages.

It is a further objective of the present invention to provide a method of programming a SNNNS type non-volatile memory device that is performed by using highly efficient channel hot electron injection to an intermediate trapping layer under predetermined applied voltages, such that a shorter programming time is provided.

It is still a further objective of the present invention to provide a method of erasing a SNNNS type non-volatile memory device that is performed by using highly efficient channel hot hole injection to an intermediate trapping layer under predetermined applied voltages, such that a shorter erasing time is provided.

It is yet a further objective of the present invention to provide a method of programming and erasing a SNNNS type non-volatile memory device, which can reduce power consumption of the memory device.

In order to achieve the above objectives, the present invention provides a method of programming and erasing a SNNNS type nonvolatile memory device. The SNNNS type non-volatile memory device comprises a semiconductor substrate with P type conductivity, a first diffusion region with N type conductivity, a second diffusion region with N type conductivity, a channel, a polysilicon gate and a stacked gate insulating layer including a bottom silicon nitride layer, an intermediate silicon nitride layer and a top silicon nitride layer. The first diffusion region is spaced from the second diffusion region and both of them formed underlying the surface of the semiconductor substrate. The channel is formed in the semiconductor substrate between the first diffusion region and the second diffusion region. The stacked gate insulating layer is formed between the polysilicon gate and the semiconductor substrate. The programming operation is performed by applying a first programming voltage to the polysilicon gate and a second programming voltage smaller than the first programming voltage to the first diffusion region and grounding the second diffusion region and the semiconductor substrate, thereby injecting channel hot electrons to the intermediate silicon nitride layer to program the memory cell to a predetermined state. The erasing operation is performed by applying a first erasing voltage to the polysilicon gate and a second erasing voltage to the first diffusion region and grounding the second diffusion region and the semiconductor substrate. The first and second erasing voltages are sufficient to cause channel hot holes to inject to the intermediate silicon nitride layer to perform the erasing operation.

BRIEF DESCRIPTION OF THE DRAWINGS

The above and other objects, features and advantages of the present invention will be apparent from the following description with reference to accompanying drawings.

DESCRIPTION OF THE PREFERRED EMBODIMENTS

Figure 1:
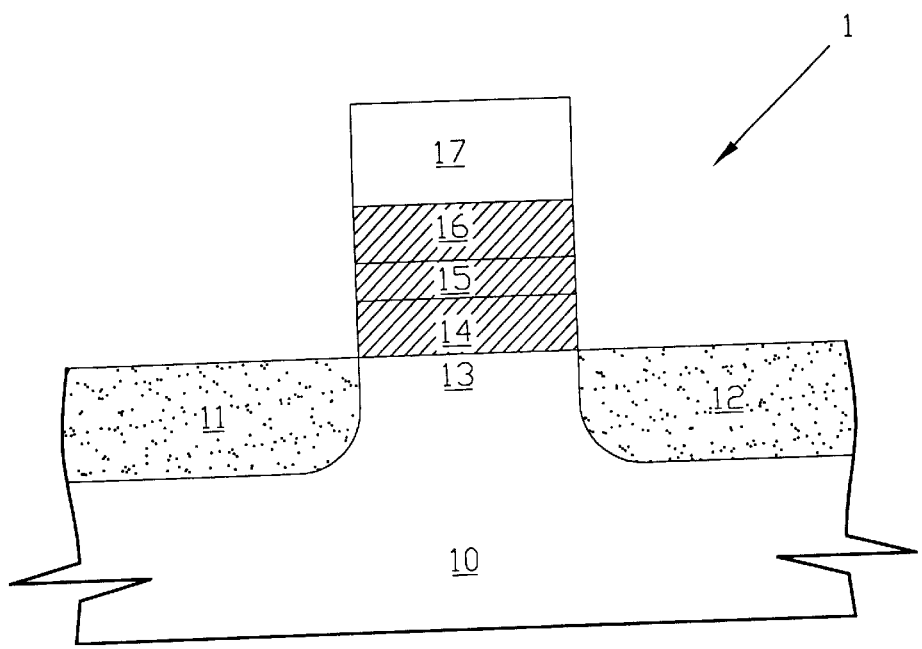
FIG. 1 is a cross-sectional view of a SNNNS type non-volatile semiconductor memory device in accordance with the present invention.

The present invention provides a non-volatile memory cell 1 with a new silicon-nitride-nitride-nitride-semiconductor (SNNNS) multi-layer structure as illustrated in FIG. 1. A P-type semiconductor substrate 10 has two buried N+ diffusion regions, one being the source 11 and the other being the drain 12. Above the channel 13 is a bottom silicon nitride layer 14, preferably approximately 40~100 angstroms thick, which forms an electrical isolation layer over the channel 13 and serves as a bottom tunneling layer. On top of the bottom silicon nitride layer 14 is an intermediate silicon nitride layer 15, preferably approximately 40~100 angstroms thick. This intermediate silicon nitride layer 15 forms the memory retention layer functioning as a charge-trapping layer. A top silicon nitride layer 16 is formed on the intermediate silicon nitride layer 15, preferably approximately 40~100 angstroms thick. The top silicon nitride layer 16, functions to electrically isolate a polysilicon gate 17 formed over the top silicon nitride layer 16 and serves as a top tunneling layer.

The programming operation of the present SNNNS type non-volatile memory cell 1 is performed by channel hot electron injection from the drain side through the bottom tunneling layer, i.e. the bottom silicon nitride layer 14, into the intermediate trapping layer, i.e. the intermediate silicon nitride layer 15. The erasing operation of the present SNNNS type non-volatile memory cell 1 is performed by channel hot hole injection from the drain side through the bottom silicon nitride layer 14 into the intermediate silicon nitride layer 15.

To program or write the present SNNNS type non-volatile memory cell 1, voltages are applied to the drain 12 and the polysilicon gate 17, the voltage applied on the polysilicon gate 17 is larger than the voltage applied on the drain 12. And, the source 11 and the semiconductor substrate 10 are grounded. These voltages respectively applied on the polysilicon gate 17 and the drain 12 generate a vertical and lateral electrical field along the length of the channel 13 from the source 11 to the drain 12. This electric field causes electrons to be drawn off the source 11 and begin accelerating towards the drain 12. As they move along the length of the channel 13, they gain energy. If they gain enough energy they are able to jump over the potential barrier of the bottom silicon nitride layer 14 into the intermediate silicon nitride layer 15 and become trapped.

Figure 2:
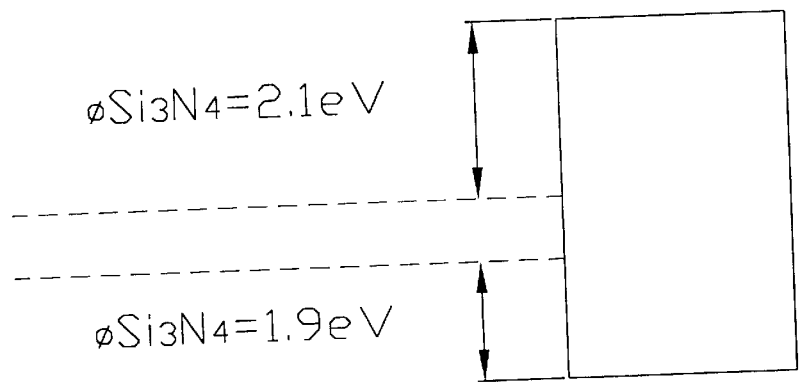
FIG. 2 is a schematic energy barrier diagram for both electron and hole associated with the gate structure of FIG. 1.

FIG. 2 is a schematic energy barrier diagram of the bottom silicon nitride layer 14 for both the electron and the hole. The bottom silicon nitride layer 14 serving as the bottom tunneling layer provides a potential barrier about 2.1 electron volts for electron, which is lower than a potential barrier about 3.2 electron volts provided by a silicon dioxide layer.

The bottom silicon nitride layer 14 provides a potential barrier about 1.9 electron volts for hole, which is also lower than a potential barrier about 4.8 electron volts provided by a silicon dioxide layer. Accordingly, the present SNNNS type non-volatile memory cell 1 can provide a highly efficient hot carrier injection, for example, in programming and erasing operations, by using the bottom silicon nitride layer 14 serving as the bottom tunneling layer.

Figure 3:
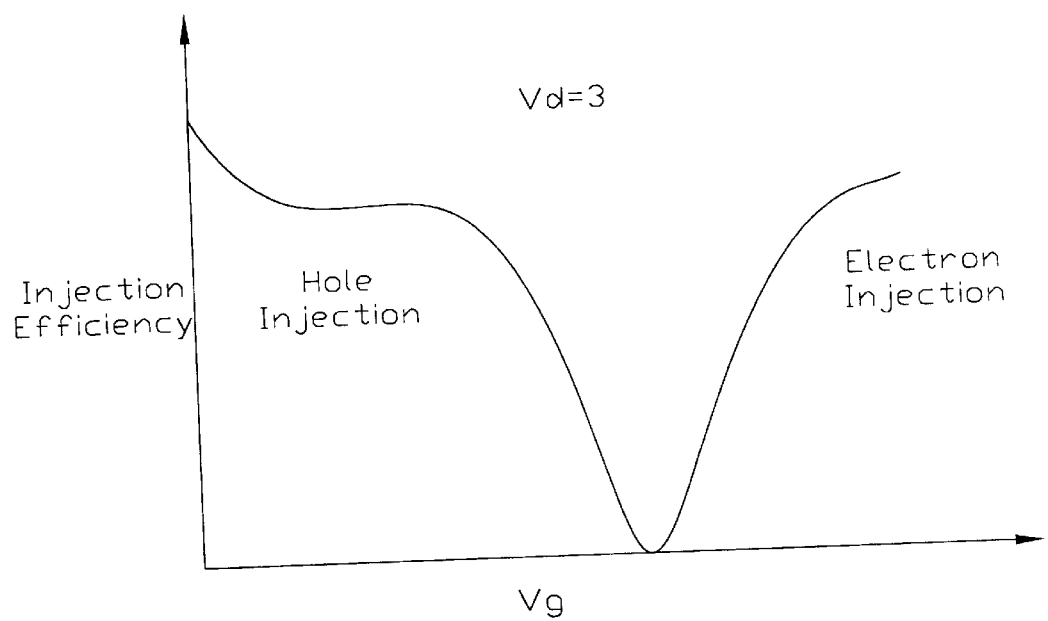
FIG. 3 is a graph of hot carrier injection efficiency vs. applied gate voltage.

When a voltage about 6~10 V applied on the polysilicon gate 17 and a voltage about 2.5~5 V applied on the drain 12, the present SNNNS type non-volatile memory cell 1 provides a highly efficient channel hot electron injection. However, when a voltage about 2~5 V applied on the polysilicon gate 17 and a voltage about 2.5~5 V applied on the drain 12, the present SNNNS type non-volatile memory cell 1 provides a highly efficient channel hot hole injection. FIG. 3 is a graph of hot carrier injection efficiency vs. $V_g$ (a voltage applied on the polysilicvon gate 17), which illustrates these superior properties of the present SNNNS type non-volatile memory cell 1. In FIG. 3, when a voltage about 3 V is applied on the drain 12, the present SNNNS type non-volatile memory cell 1 provides a highly efficient hot electron injection under a voltage about 6~10 V applied on the polysilicon gate 17. While the present SNNNS type non-volatile memory cell 1 provides a highly efficient hot hole injection under a voltage about 2~5 V applied on the polysilicon gate 17.

Accordingly, the present invention provides a method of programming and erasing the SNNNS type non-volatile memory cell 1, which can show improved performance characteristics such as shorter programming/erasing times and lower voltages for programming and erasing. These improved performance characteristics are obtained by utilizing the property of highly efficient hot carrier injection that is enhanced under predetermined voltages.

The present method of programming the SNNNS type non-volatile memory cell 1 is performed under the following conditions. A first programming voltage about 6~10 V is applied on the polysilicon gate 17. A second programming voltage about 2.5~5 V is applied on the drain 12. The source 11 and the semiconductor substrate 10 are grounded. Thereby, injecting channel hot electrons through the bottom silicon nitride layer 14 into the intermediate silicon nitride layer 15 and trapping the hot electrons therein to program the memory cell to a predetermined state.

The present method of erasing the SNNNS type non-volatile memory cell 1 is performed under the following conditions. A first erasing voltage about 2~5 V is applied on the polysilicon gate 17. A second erasing voltage about 2.5~5 V is applied on the drain 12. The source 11 and the semiconductor substrate 10 are grounded. Thereby, injecting channel hot holes through the bottom silicon nitride layer 14 into the intermediate silicon nitride layer 15 to perform the erasing operation.

The preferred embodiments are only used to illustrate the present invention, not intended to limit the scope thereof. Many modifications of the preferred embodiments can be made without departing from the spirit of the present invention.

What is claimed is:

1. A method of programming a SNNNS type non-volatile memory cell, said memory cell having a semiconductor substrate, a first diffusion region, a second diffusion region, said second diffusion region being spaced from said first diffusion region and both of them formed underlying the surface of said semiconductor substrate, a channel formed in said semiconductor substrate between said first diffusion region and said second diffusion region, a polysilicon gate and a stacked gate insulating layer including a top silicon nitride layer, an intermediate silicon nitride layer and a bottom silicon nitride layer formed between said polysilicon gate and said channel, said method comprising:

applying a first programming voltage to said polysilicon gate;

applying a second programming voltage lower than said first programming voltage to said first diffusion region; and grounding said second diffusion region and said semiconductor substrate;

thereby to inject channel hot electrons to said intermediate silicon nitride layer to program said memory cell to a predetermined state.

2. The method of claim 1, wherein the conductivity of said semiconductor substrate is different from the conductivity of said first and said second diffusion regions.

3. The method of claim 2, wherein said semiconductor substrate has P type conductivity and both of said first and said second diffusion regions have N type conductivity.

4. The method of claim 1, wherein said first programming voltage is in the range about 6~10 V.

5. The method of claim 1, wherein s aid second programming voltage is in the range about 2.5~5 V.

6. The method of claim 1, wherein said first programming voltage is in a range about 6~10 V and said second programming voltage is in a range about 2.5~5 V.

7. The method of claim 1, wherein the thickness of said top silicon nitride layer is about 40 to 100 angstroms.

8. The method of claim 1, wherein the thickness of said intermediate silicon nitride layer is about 40 to 100 angstroms.

9. The method of claim 1, wherein the thickness of said bottom silicon nitride layer is about 40 to 100 angstroms.

10. A method of erasing a SNNNS type non-volatile memory cell, said memory cell having a semiconductor substrate, a first diffusion region, a second diffusion region, said second diffusion region being spaced from said first diffusion region and both of them formed underlying the surface of said semiconductor substrate, a channel formed in said semiconductor substrate between said first diffusion region and said second diffusion region, a polysilicon gate and a stacked gate insulating layer including a top silicon nitride layer, an intermediate silicon nitride layer and a bottom silicon nitride layer formed between said polysilicon gate and said channel, said method comprising:

applying a first erasing voltage to said polysilicon gate;

applying a second erasing voltage to said first diffusion region; and grounding said second diffusion region and said semiconductor substrate;

wherein said first erasing voltage and said second erasing voltage are sufficient to cause channel hot holes to inject to said intermediate silicon nitride layer to perform a data erasing operation.

11. The method of claim 10, wherein the conductivity of said semiconductor substrate is different from the conductivity of said first and said second diffusion regions.

12. The method of claim 10, wherein said semiconductor substrate has P type conductivity and both of said first and said second diffusion regions have N type conductivity.

13. The method of claim 10, wherein said first erasing voltage is in a range about 2~5 V.

14. The method of claim 10, wherein said second erasing voltage is in a range about 2.5~5 V.

15. The method of claim 10, wherein said first erasing voltage is in a range about 2~5 V and said second erasing voltage is in a range about 2.5~5 V.

16. The method of claim 10, wherein the thickness of said top silicon nitride layer is about 40 to 100 angstroms.

17. The method of claim 10, wherein the thickness of said intermediate silicon nitride layer is about 40 to 100 angstroms.

18. The method of claim 10, wherein the thickness of said bottom silicon nitride layer is about 40 to 100 angstroms.

* * * * *